(12) United States Patent
Wong et al.

(10) Patent No.: US 7,378,896 B2
(45) Date of Patent: May 27, 2008

(54) SINGLE PIN FOR MULTIPLE FUNCTIONAL CONTROL PURPOSES

(75) Inventors: Footshen Wong, Singapore (SG); Vlad Popescu-Stenesti, San Jose, CA (US); Mingkwang Han, Singapore (SG); Winson Wong, Singapore (SG); Chun-Hsi Lin, Yi-Lan Shien (TW)

(73) Assignee: O2Micro International Ltd., Grand Caymen (KY)

( * ) Notice: Subject to any disclaimer, the term of this patent is extended or adjusted under 35 U.S.C. 154(b) by 86 days.

(21) Appl. No.: 11/273,292

(22) Filed: Nov. 14, 2005

(65) Prior Publication Data

US 2006/0255839 A1    Nov. 16, 2006

Related U.S. Application Data

(60) Provisional application No. 60/680,912, filed on May 13, 2005.

(51) Int. Cl.
  *H03L 5/00* (2006.01)
(52) U.S. Cl. .................. 327/333; 327/142; 327/143
(58) Field of Classification Search ............... None
  See application file for complete search history.

(56) References Cited

U.S. PATENT DOCUMENTS

| | | | | |
|---|---|---|---|---|
| 4,409,455 A | * | 10/1983 | Belcher et al. | ............. 219/775 |
| 4,614,880 A | * | 9/1986 | Go et al. | .................... 327/143 |
| 5,140,183 A | * | 8/1992 | Takenaka | .................... 327/543 |
| 5,760,625 A | * | 6/1998 | Macks | ......................... 327/198 |
| 6,310,492 B1 | * | 10/2001 | Ikoma et al. | ................. 326/81 |
| 6,373,285 B1 | * | 4/2002 | Konishi | ....................... 326/81 |
| 6,448,824 B1 | * | 9/2002 | Rodriguez et al. | ............ 327/74 |
| 6,870,413 B1 | * | 3/2005 | Chang et al. | ............... 327/205 |
| 7,176,740 B2 | * | 2/2007 | Tachibana et al. | .......... 327/333 |
| 2004/0140842 A1 | * | 7/2004 | Lee et al. | .................... 327/333 |
| 2005/0195012 A1 | * | 9/2005 | Sueoka et al. | .............. 327/333 |

* cited by examiner

*Primary Examiner*—Tuan T Lam
(74) *Attorney, Agent, or Firm*—Wang Law Firm, Inc.; Li K. Wang

(57) ABSTRACT

A method for using a single pin to support both power input and power control functions for an integrated circuit, wherein the integrated circuit is in communication with a system. The method includes receiving at the pin a power input signal from the system, generating a power control signal based on the power input signal through a control signal generating circuit, and sending the power control signal to the integrated circuit.

8 Claims, 2 Drawing Sheets

SINGLE PIN FOR MULTIPLE FUNCTIONAL CONTROL PURPOSES

RELATED APPLICATION

This application claims the benefit of U.S. Provisional Application No. 60/680,912, "SINGLE PIN TO SUPPORT THE MULTIPLE CONTROL FUNCTIONS, POWER INPUT AND ENABLE/DISABLE", filed on May 13, 2005, the specification of which is hereby incorporated in its entirety by this reference.

BACKGROUND OF THE INVENTION

1. Field of the Invention

The invention relates to power control for electrical circuits, and more specifically to power control for electrical circuit through reduced pin count.

2. Description of the Related Art

A power supply voltage delivered to a circuit generally determines the standard digital threshold level of the circuit (also known as the voltage standard of the circuit), and the digital threshold level of input signals should be consistent with the digital threshold level of the circuit. When an integrated circuit (IC) is coupled to a system, it has several inputs, which may include data inputs (digital inputs) from the system, a power supply, and a power control signal from the system that enables or disables the IC. Usually, the voltage standards for the IC and for the system can be different from each other. For example, the voltage standard of the system may be 1.5V, or 1.8V, while the power supply voltage to the IC may be 3.3V or 5.0V. Consequently, the IC may not be able to receive digital inputs from the system directly because of the voltage difference. It may require a conversion to adjust the voltage of the digital inputs to meet the voltage standards of the IC.

Additionally, the IC may also requires a power input signal from the system to power the digital inputs, because the power supply voltage that powers the digital inputs should be consistent with the voltage standard of the digital inputs. Therefore, the IC should have a power input pin that receives the power input signal from the system to power the digital inputs. As previously stated, the IC may also receive a power control signal from the system that instructs the IC when to power on or power down. Traditionally, an additional pin is employed by the IC to receive the power control signal. However, given the facts that the power input signal and power control signal both are generally from the same system and that it is not necessary for the IC to be powered when the system is powered off, it is desirable to have a single pin for power input and power control. As a result, the reduced pin count will advantageously reduce the power consumption and the cost. Thus, it is to such an apparatus and method that enables a single pin to support both the power input function and the power control function the present invention is primarily directed.

SUMMARY OF THE INVENTION

The present invention advantageously provides a method and an apparatus using a single pin to support power input function and power control function for an integrated circuit. As a result, the goal of reducing the pin count and reducing the power consumption of the integrated circuit can be achieved.

There is provided a method for using a single pin to support both power input and power control functions for an integrated circuit, wherein the integrated circuit is in communication with a system. The method includes receiving at the pin a power input signal from the system, generating a power control signal based on the power input signal through a control signal generating circuit, and sending the power control signal to the integrated circuit. The power control signal is used to control the power status of the integrated circuit.

There is also provided an apparatus for using a single pin to support both power input and power control functions for an integrated circuit, wherein the apparatus is capable of communicating with a system and the integrated circuit. The apparatus includes a data pad in communication between the system and the integrated circuit and a control signal generating circuit coupled to the pin and the integrated circuit. The data pad is capable of receiving input signals from the system and adjusting the input signals for use by the integrated circuit. The data pad is further coupled to the pin and the data pad receives a power input signal from the system through the pin and is powered at least by the power input signal. The control signal generating circuit detects the power input signal at the pin and generates a power control signal to control the power status of the integrated circuit based on the power input signal.

BRIEF DESCRIPTION OF THE DRAWINGS

Features and advantages of embodiments of the invention will become apparent as the following Detailed Description proceeds, and upon reference to the Drawings, where like numerals depict like elements, and in which.

DETAILED DESCRIPTION OF THE INVENTION

Figure 1:
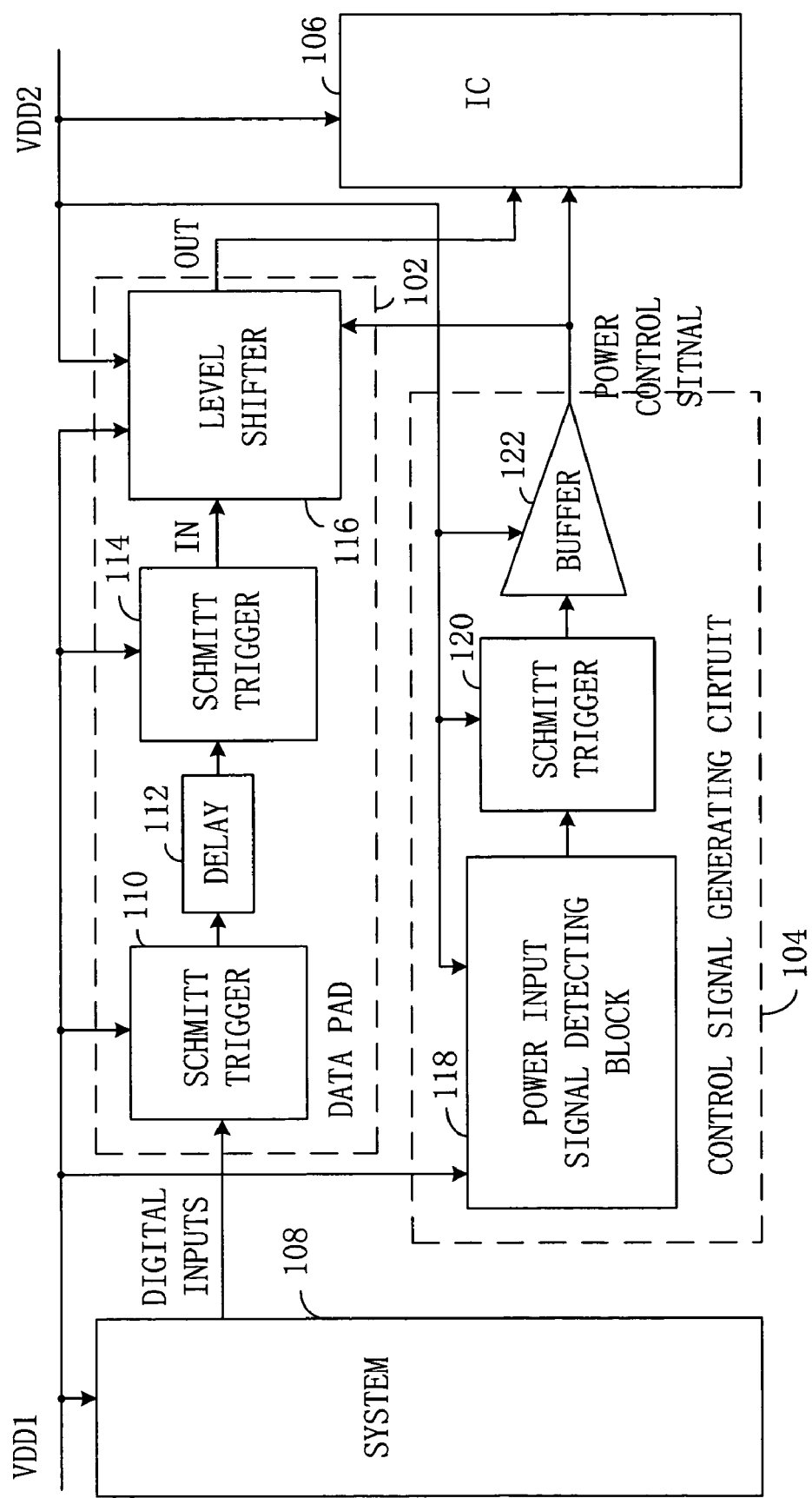
FIG. 1 illustrates a block diagram of a circuit using a single pin to support the power input function and the power control function.

FIG. 1 illustrates a block diagram of a circuit using a single pin to support the power input function and the power control function. The embodiment includes two blocks: a data pad 102 and an internal power control signal generating circuit 104. The circuit has a pin (VDD1 pin) receiving power input signal VDD1 from a system 108.

The data pad 102 interfaces between an IC 106 and a system 108 and includes a first Schmitt trigger 110, a delay module 112 coupled to the first Schmitt trigger 110, a second Schmitt trigger 114 coupled to the delay module 112, and an optional level shifter 116 coupled to the second Schmitt trigger 114. The first Schmitt trigger 110 receives a power input signal VDD1 from the system 108 and digital input signals from the system 108. The first and the second Schmitt triggers 110, 114 are capable of adjusting the digital input signals generated from the system 108 for use by the IC 106. Due to the hysteretic characteristic of Schmitt trigger, the Schmitt triggers 110, 114 are able to eliminate the fluctuations of the digital input signals generated from the system 108. It is appreciated by those skilled in the art that the Schmitt triggers used herein can be of any type. The level shifter 116 receives a power supply VDD2 from the IC 106, a power input signal VDD1 from the system 108, digital inputs from the system 108, and a power control signal generated by the power control signal generating circuit 104. When the voltage standard of the IC 106 is incompatible with that of the system 108, the level shifter 116 is used to scale up or scale down the voltage level of the digital inputs from the system 108 to a desired voltage level set by the IC 106. For example, if the digital input signals whose voltage standard is consistent with VDD1 has a voltage of 1.8 V and the power supply of the IC (VDD2) is 3.3V, the level shifter 116 is required to scale up the voltage swing of the digital input signals from 1.8V to 3.3V for internal usage of the digital inputs in the IC 106. It should be noted that level shifter may be omitted when the voltage standard of the system 108 is consistent with that of the IC 106.

The power control signal generating circuit 104 includes a power input signal detecting block 118, a Schmitt trigger 120, and a buffer 122. The power control signal generating circuit 104 is capable of detecting the power input signal VDD1 at the pin and generating a power control signal to enable or disable the IC according to the voltage level of VDD1. For instance, if the voltage standard of the system is 1.8V and the VDD1 is far below 1.8V, the power control signal generating circuit 104 will generate a power down signal to power down the IC 106. Conventionally, the power control signal is provided by the system 108 through a dedicated pin. By detecting the voltage at VDD1 pin and generating the power control signal according to the detected VDD1, the present invention advantageously reduces the pin count, thereby saving the cost and reducing the power consumption of the IC since the power consumption of an IC is influenced by the number of pins that the IC have. The data pad 102 also receives the power control signal generated by the power control signal generating circuit 104 and uses the power control signal to control the data transmission. When the power control signal is LOW, the data pad stops sending data to the IC 106. When the power control signal is HIGH, the data pad is allowed to send data to the IC 106.

Figure 2:
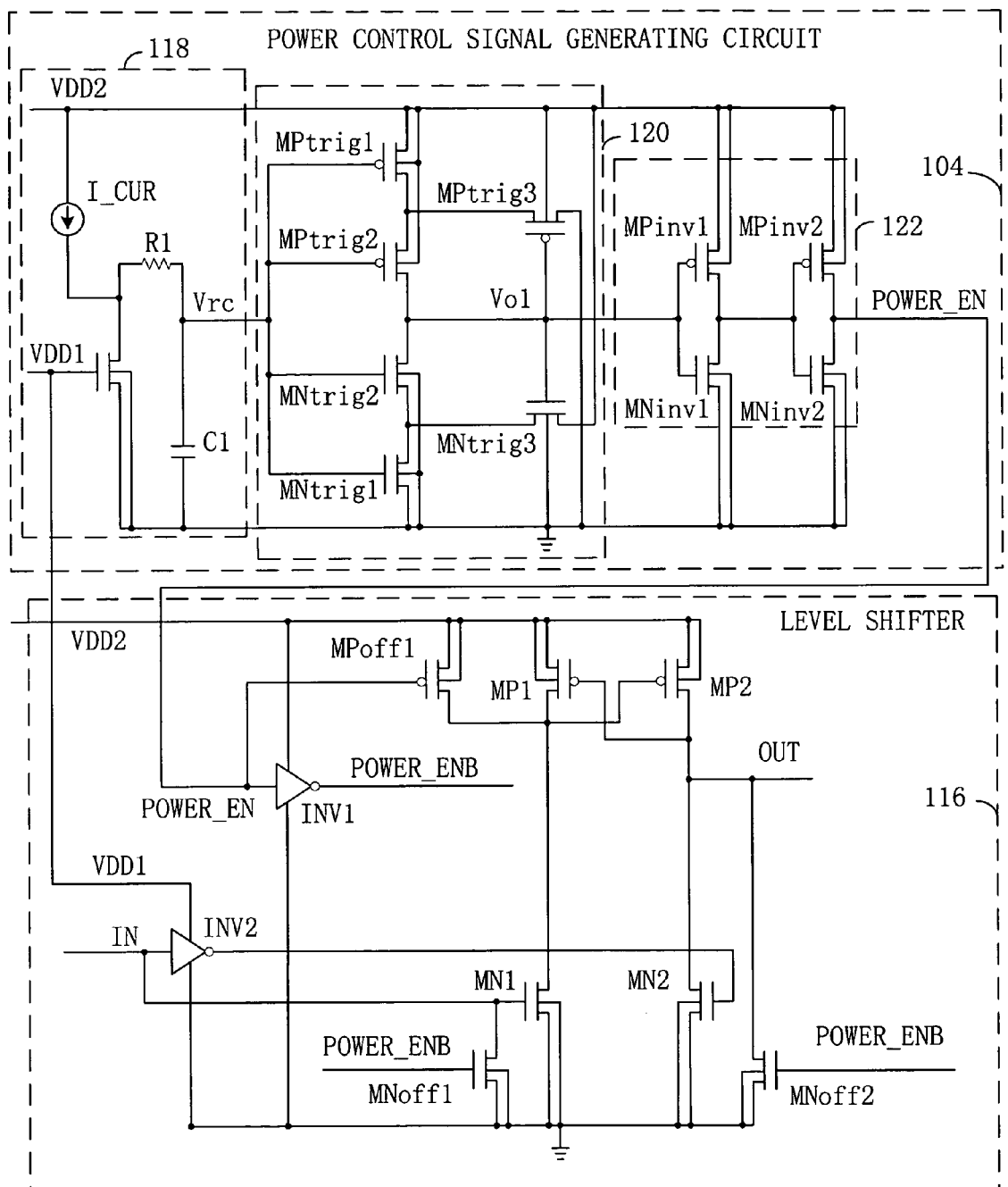
FIG. 2 illustrates a detailed schematic of some blocks in FIG. 1

FIG. 2 illustrates a detailed schematic of the level shifter 116 and the power control signal generating circuit 104. Referring to the power input signal detecting block 118, when VDD1 is LOW or the system is powered off, a current source I_CUR constantly charges up the capacitor C1. As a result, the output Vrc of block 118 is pulled up to HIGH. The Schmitt trigger set the voltage at Vo1 to LOW and hence the POWER_EN signal is also LOW after passing through a buffer 122. The POWER_EN signal in this case represents a power down signal and powers down the IC. In a converse condition, when VDD1 is asserted to a desired level, e.g., 1.8V, or the system is powered on, the transistor MN1 is turned on and pulls down the current from the current source I_CUR as well as discharges the capacitor C1. As a result, the output of the Schmitt trigger Vo1 is asserted to HIGH. Therefore, the POWER_EN signal is also HIGH after passing through a buffer 122. The POWER_EN signal in this case represents a power on signal and powers on the IC. The buffer 122 is used to increase the driving capability of the POWER_EN signal.

Referring to the level shifter 116 illustrated in FIG. 2, when the digital input IN is HIGH (VDD1 e.g. 1.8V corresponding to the voltage level of the system) and the POWER_EN is also HIGH, the digital input turns on the transistor MN1, but turns off the transistor MN2, and hence turns on transistor MP2 while turns off the transistor MP1. This will scale up the output voltage OUT of the level shifter 116 to HIGH (VDD2 e.g. 3.3V). When POWER_EN is LOW, the output POWER_ENB of the inverter INV1 is asserted to HIGH, which in turn pulls down the OUT to LOW.

The terms and expressions which have been employed herein are used as terms of description and not of limitation, and there is no intention, in the use of such terms and expressions, of excluding any equivalents of the features shown and described (or portions thereof, and it is recognized that various modifications are possible within the scope of the claims. Other modifications, variations, and alternatives are also possible. Accordingly, the claims are intended to cover all such equivalents.

What is claimed is:

1. A method for using a single pin at a device to support both power input and power control functions for an integrated circuit, wherein the integrated circuit is in communication with a system and the device having a data pad and a control signal generating circuit, the method comprising the steps of:
    receiving at the pin a power input signal from the system;
    adjusting at a first Schmitt trigger digital inputs from the system;
    adjusting at a second Schmitt trigger adjusted digital inputs from the first Schmitt trigger after a time delay;
    receiving at a level shifter twice adjusted digital inputs from the second Schmitt trigger;
    receiving at the control signal generating circuit the power input signal from the single pin;
    generating at the control signal generating circuit a power control signal based on the power input signal, the power control signal have a level;
    receiving at the data pad the power control signal;
    controlling data transmission between the data pad and the integrated circuit according to the level of the power control signal and the twice regulated digital inputs; and
    sending the power control signal from the control signal generating circuit to the integrated circuit to control a power status of the integrated circuit.

2. The method of claim 1, wherein the control signal generating circuit further detecting the power input signal at the pin and generating the power control signal to power off or power on the integrated circuit based on the power input signal.

3. The method of claim 1, wherein the power input signal providing power to input signals.

4. The method of claim 3, wherein the input signals are generated by the system and the integrated circuit receives the input signals.

5. An apparatus for using a single pin to support both power input and power control functions for an integrated circuit, the apparatus communicating with a system and the integrated circuit, comprising:
    a pin receiving a power input signal from the system;
    a data pad in communication with the pin, the system and the integrated circuit, the data pad receiving input signals from the system and adjusting the input signals for use by the integrated circuit, the data pad receiving a power input signal from the pin, the data pad comprising a first Schmitt trigger, a delay module, a second Schmitt trigger and a level shifter coupled in series; and
    a control signal generating circuit in communication with the pin, the data pad, and the integrated circuit, wherein the control signal generating circuit detecting the power input signal at the pin and generating a power control signal to control the level shifter for data transmission purpose and the power stains of the integrated circuit based on the power input signal,
    wherein the data pad receiving the power control signal and transmitting an output to the integrated circuit according to the power control signal.

6. The apparatus of claim 5, wherein the control signal generating circuit further comprising at least a Schmitt trigger adjusting the power control signal for use by the integrated circuit.

7. The apparatus of claim 5, wherein the first and second Schmitt triggers improving stability of the input signals.

8. The apparatus of claim 7, wherein the level shifter is coupled to the second Schmitt trigger of the data pad and the integrated circuit, the level shifter adjusting the voltage level of the input signals to meet the voltage standard of the integrated circuit.

* * * * *